US007940140B2

(12) United States Patent
Zeng et al.

(10) Patent No.: US 7,940,140 B2
(45) Date of Patent: May 10, 2011

(54) SELF-CALIBRATED WIDE RANGE LC TANK VOLTAGE-CONTROLLED OSCILLATOR (VCO) SYSTEM WITH EXPANDED FREQUENCY TUNING RANGE AND METHOD FOR PROVIDING SAME

(75) Inventors: Yi Zeng, Fremont, CA (US); Freeman Zhong, San Ramon, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/156,607

(22) Filed: Jun. 3, 2008

(65) Prior Publication Data

US 2009/0295488 A1 Dec. 3, 2009

(51) Int. Cl.
*H03L 7/099* (2006.01)
*H03L 1/00* (2006.01)
*H03B 5/08* (2006.01)

(52) U.S. Cl. .......... 331/179; 331/36 C; 331/44; 331/49; 331/167; 331/186

(58) Field of Classification Search .......... 331/2, 36 C, 331/44, 46, 48, 49, 56, 117 FE, 117 R, 167, 331/179, 183, 185, 186
See application file for complete search history.

(56) References Cited

U.S. PATENT DOCUMENTS

| | | | | |
|---|---|---|---|---|
| 5,212,460 A * | 5/1993 | Tamagawa | ............. | 331/116 FE |
| 5,686,864 A * | 11/1997 | Martin et al. | ................. | 331/1 A |
| 6,753,738 B1 * | 6/2004 | Baird | ............................. | 331/25 |
| 7,068,989 B2 * | 6/2006 | Yonekura | ...................... | 455/260 |
| 7,221,920 B2 * | 5/2007 | Abe et al. | ...................... | 455/255 |
| 7,301,411 B2 * | 11/2007 | Li Puma et al. | ............... | 331/167 |
| 7,408,415 B2 * | 8/2008 | Dielt et al. | ...................... | 331/16 |
| 7,474,358 B2 * | 1/2009 | Miyamoto | ................... | 348/723 |
| 7,519,140 B2 * | 4/2009 | Yoshimura | .................... | 375/376 |
| 7,663,446 B1 * | 2/2010 | Surin | ............................ | 331/185 |

* cited by examiner

*Primary Examiner* — Levi Gannon
(74) *Attorney, Agent, or Firm* — Suiter Swantz pc llo

(57) ABSTRACT

The present invention is a self-calibrating, dual-band, wide range LC tank Voltage Controlled Oscillator (VCO) system. The system may include a first Voltage-Controlled Oscillator (VCO) and a second Voltage-Controlled Oscillator (VCO). The system may further include a calibration engine. The calibration engine may be configured for being connectable to at least one of the first VCO or the second VCO. The calibration engine may further be configured for automatically establishing/providing a VCO fix capacitor band code setting and a gear control setting for selectively activating or inactivating the first VCO and/or the second VCO. The calibration engine may be further configured for automatically comparing a VCO control voltage of the system to an allowable control voltage range for the system and may be further configured for automatically adjusting the VCO fix capacitor band code setting and/or the gear control setting when the VCO control voltage falls outside of the allowable control voltage range.

19 Claims, 3 Drawing Sheets

SELF-CALIBRATED WIDE RANGE LC TANK VOLTAGE-CONTROLLED OSCILLATOR (VCO) SYSTEM WITH EXPANDED FREQUENCY TUNING RANGE AND METHOD FOR PROVIDING SAME

FIELD OF THE INVENTION

The present invention relates to the field of Serializer/Deserializer (SERDES) design and particularly to a system and method for providing an LC tank Voltage-Controlled Oscillator (VCO) with an expanded frequency tuning range.

BACKGROUND OF THE INVENTION

LC tank oscillators may be implemented in SERDES designs due to their favorable phase noise performance when compared to some other types of oscillators. However, current LC tank oscillators may not provide as broad a frequency tuning range as some other types of oscillators.

Therefore, it may be desirable to provide a solution which addresses the above-referenced problems associated with current LC tank oscillators.

SUMMARY OF THE INVENTION

Accordingly, an embodiment of the present invention is directed to a self-calibrating, dual-band, wide range LC tank Voltage-Controlled Oscillator (VCO) system, including: a first Voltage-Controlled Oscillator (VCO); a second Voltage-Controlled Oscillator (VCO); a calibration engine, the calibration engine configured for being connectable to at least one of the first VCO and the second VCO, the calibration engine further configured for automatically establishing and automatically providing a VCO fix capacitor band code setting and a gear control setting for at least one of selectively activating and selectively inactivating at least one of the first VCO and the second VCO, wherein the calibration engine is further configured for automatically comparing a VCO control voltage of the system to a lower threshold voltage and an upper threshold voltage, the lower threshold voltage being a minimum allowable control voltage for the system, the upper threshold voltage being a maximum allowable control voltage for the system, the calibration engine being further configured for at least one of automatically adjusting the VCO fix capacitor band code setting and automatically adjusting the gear control setting when the VCO control voltage is at least one of greater than the upper threshold voltage and lower than the lower threshold voltage.

A further embodiment of the present invention is directed to a method for providing a self-calibrating, dual-band, wide range LC tank Voltage-Controlled Oscillator (VCO) system, including: providing a gear control setting and a VCO fix capacitor band code setting; comparing a VCO control voltage of the system to a minimum allowable control voltage for the system and a maximum allowable control voltage for the system; and when the VCO control voltage is determined as being at least one of greater than the minimum allowable control voltage and equal to the minimum allowable control voltage and when the VCO control voltage is determined as being at least one of less than the maximum allowable control voltage and equal to the maximum allowable control voltage, saving the gear control setting and the VCO fix capacitor band code setting and providing an indication that calibration is finished.

An additional embodiment of the present invention is directed to a computer-readable medium having computer-executable instructions for performing a method for providing a self-calibrating, dual-band, wide range LC tank Voltage-Controlled Oscillator (VCO) system, said method including: providing a gear control setting and a VCO fix capacitor band code setting; comparing a VCO control voltage of the system to a minimum allowable control voltage for the system and a maximum allowable control voltage for the system; and when the VCO control voltage is determined as being at least one of greater than the minimum allowable control voltage and equal to the minimum allowable control voltage and when the VCO control voltage is determined as being at least one of less than the maximum allowable control voltage and equal to the maximum allowable control voltage, saving the gear control setting and the VCO fix capacitor band code setting and providing an indication that calibration is finished.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

The quality of the clock is critical for a successful Serializer/Deserializer (SERDES) design. A high quality clock is necessary for advancing SERDES design into the range of 10 Gigabits per second (10 Gbps) and beyond. Currently, an oscillator designer has a few different available options when selecting an oscillator for implementation in said SERDES design. Two such options would be: 1) a ring oscillator; and 2) an LC tank oscillator. In comparing the two options, currently available ring oscillators are advantageous in that they generally occupy a smaller area and provide a larger frequency tuning range than currently available LC tank oscillators. However, the currently available LC tank oscillators are advantageous in that they generally provide much better phase noise performance (ex.—in the range of −20 decibels relative to the carrier/Hertz (−20 dBc/Hz) to −30 decibels relative to the carrier/Hertz (−30 dBc/Hz)). This superior phase noise performance for the LC tank oscillators may be attributable to the filtering effect of tank impedance to transistor thermal noise. Due to this superior phase noise performance, if one Phase-Locked Loop (PLL) is shared by a number of transceivers (ex.—4 to 8 transceivers), the area penalty imposed when implementing currently available LC tank oscillators may be acceptable/justifiable in some cases. However, in many cases, the above-described frequency tuning range limitations imposed by said currently available LC tank oscillators may make their implementation in SERDES designs undesirable.

A number of approaches have been implemented to increase/expand the frequency tuning range of currently available LC tank oscillators. The existing approaches have often attempted to expand/increase the frequency tuning range of LC tank oscillators by reducing the parasitic capacitance of the LC tank/LC tank circuit. However, such approaches have yielded less than desired results (ex.—up to ±10%), since parasitic capacitance hasn't been shown to be reducible to zero. The present invention addresses the frequency tuning range limitations imposed by currently available LC tank oscillators by providing an LC tank oscillator with an expanded frequency tuning range (ex.—maximum frequency/minimum frequency ratio may be as large as 2-to-1), thereby providing an LC tank oscillator which may be desirable for implementation in SERDES designs over currently available ring oscillators and currently available LC tank oscillators. Further by achieving a 2:1 ratio of LC Phase-Locked Loop (LCPLL) frequency range, the present invention may promote legacy compliance.

Reference will now be made in detail to the presently preferred embodiments of the invention, examples of which are illustrated in the accompanying drawings.

Figure 1:
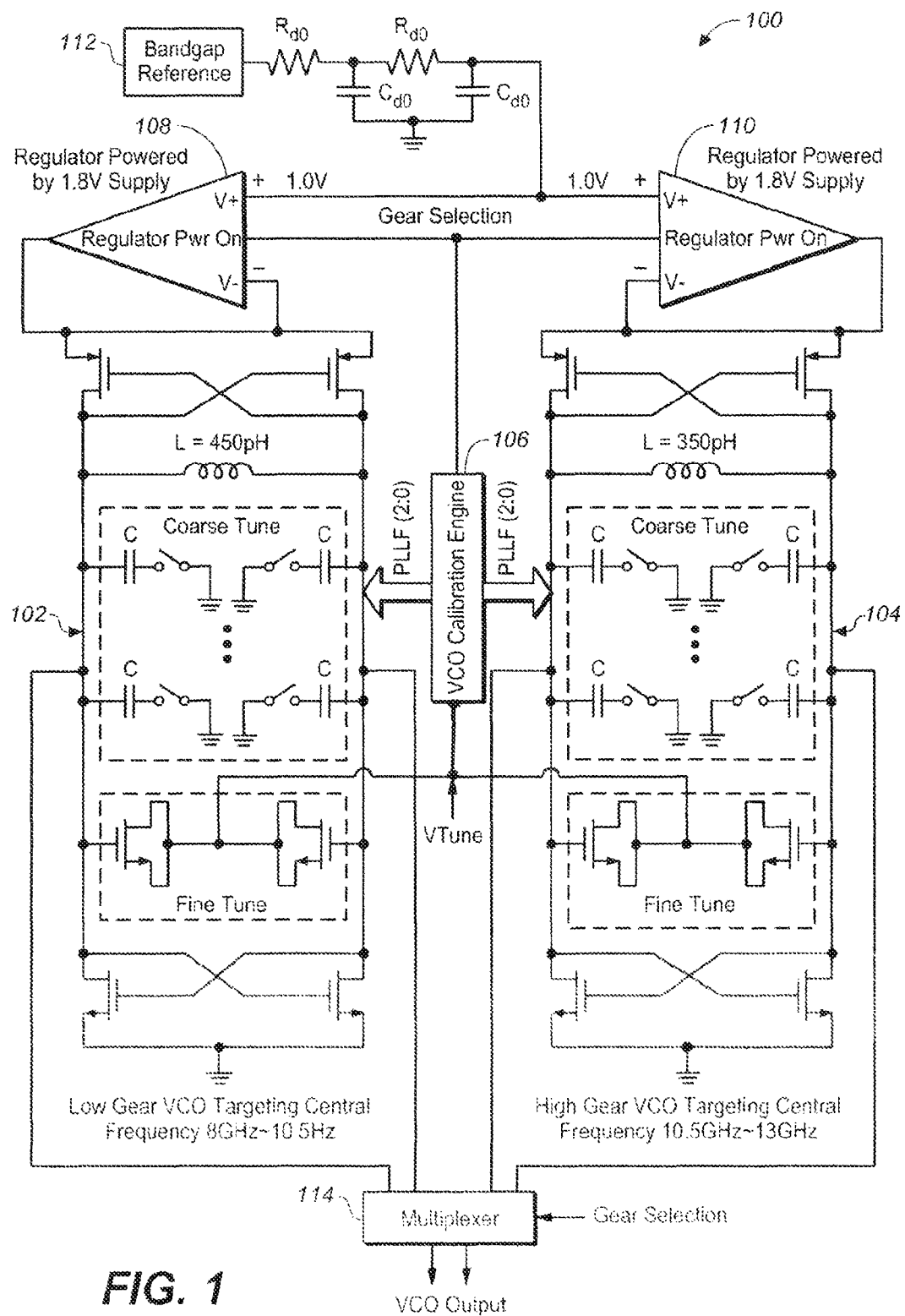
FIG. 1 is an illustration of a self-calibrated, dual band, wide range LC tank Voltage-Controlled Oscillator VCO system in accordance with an exemplary embodiment of the present invention.

Referring generally to FIG. 1, a LC tank Voltage Controlled Oscillator (VCO) system 100 in accordance with an exemplary embodiment of the present invention is shown. The system 100 may include a first VCO 102 and a second VCO 104. The first VCO 102 may be a low gear VCO. For instance, the low gear VCO 102 may be configured for providing a targeted central frequency having a value ranging from approximately 8 Gigahertz (GHz) to approximately 10.5 GHz. The second VCO 104 may be a high gear VCO. For example, the high gear VCO 104 may be configured for providing a targeted central frequency having a value ranging from approximately 10.5 GHz to approximately 13 GHz.

In exemplary embodiments, the low gear VCO 102 and the high gear VCO 104 may collectively be configured for allowing the LC tank VCO system 100 to provide a targeted central frequency having a value ranging from approximately 8 GHz to approximately 13 GHz. In further embodiments, depending on the targeted central frequency value sought, the system 100 is configured for turning on/powering on/activating either the low gear VCO 102 or the high gear VCO 104 at a given time. For example, when the targeted central frequency sought is a value within the range of approximately 8 GHz to approximately 10.5 GHz, the low gear VCO 102 may be activated (ex.—may be active), while the high gear VCO 104 may be inactive/not powered on/not turned on. Alternatively, when the targeted central frequency sought is a value within the range of approximately 10.5 GHz to approximately 13 GHz, the high gear VCO 104 may be active, while the low gear VCO 102 may be inactive.

Figure 2:
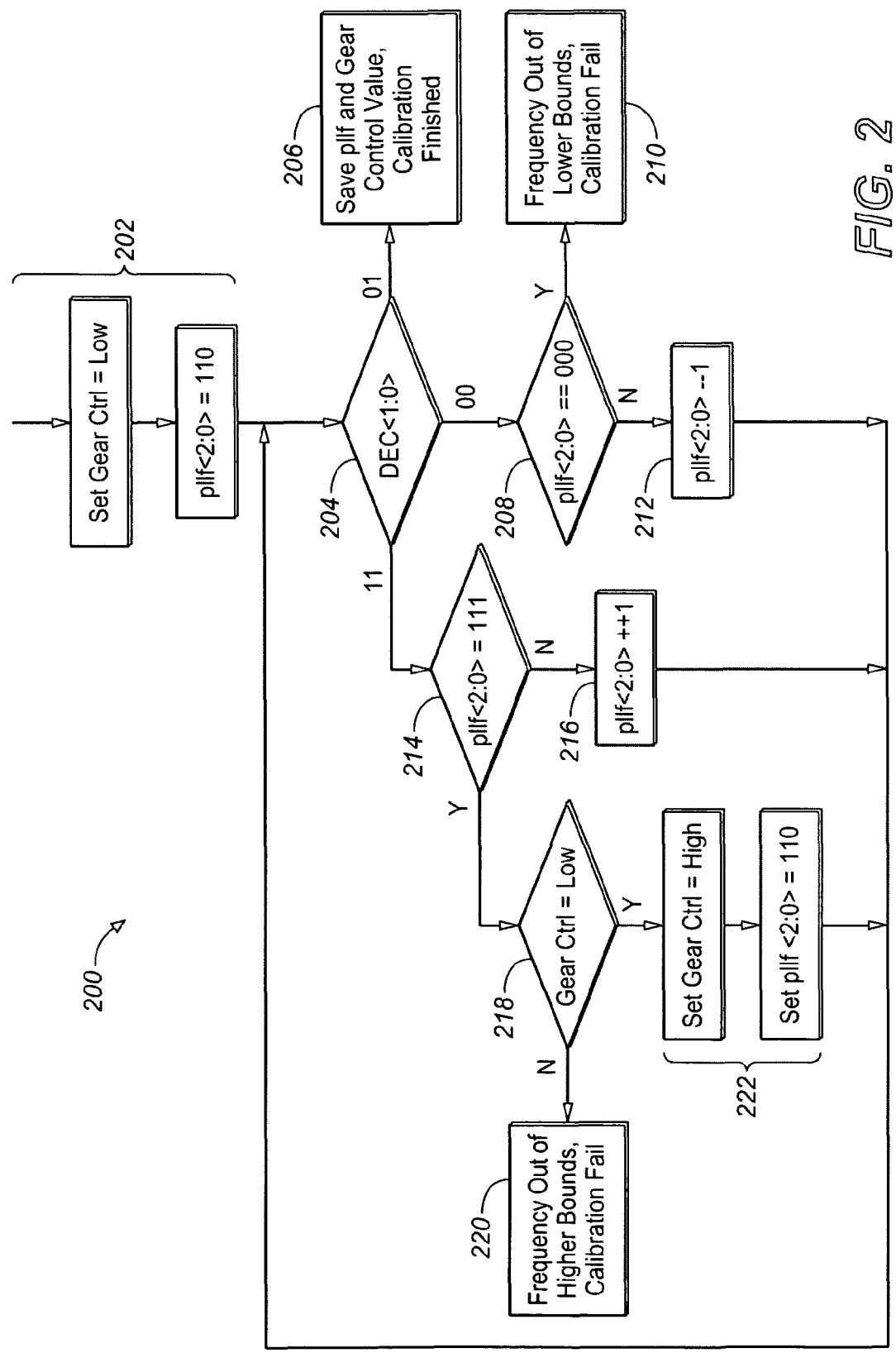
FIG. 2 is a flow diagram illustrating a method for calibrating the system shown in FIG. 1 in accordance with an exemplary embodiment of the present invention.

In further embodiments of the present invention, the system 100 may include a calibration engine 106. The calibration engine 106 may be configured for being connected to/communicatively coupled/selectively connectable with the low gear VCO 102 and/or the high gear VCO 104. For instance, the calibration engine 106 may be a mixed mode VCO calibration engine. Further, during chip power on, the mixed mode calibration engine 106 may be configured for automatically setting/providing a desired/proper VCO fix capacitor band code (ex.—PLLF<2:0>) and a desired/proper gear control code (ex.—gear selection, such as code or a signal for causing the low gear VCO 102 and/or the high gear VCO to be selectively activated/inactivated) for/to the system 100 through a calibration process (such as shown in FIG. 2), which will be discussed in detail below.

In exemplary embodiments, the system 100 may include a first power supply regulator 108 and a second power supply regulator 110. The first power supply regulator 108 and/or the second power supply regulator 110 may be connected to/communicatively coupled with the calibration engine 106. The first power supply regulator 108 may be configured for being powered by a power supply, such as a 1.8 Volt (1.8 V) power supply. Further, the second power supply regulator 110 may also be configured for being powered by a power supply, such as a 1.8 V power supply. The first power supply regulator 108 may be configured for being connected with the low gear VCO 102 and may further be configured for selectively providing power to the low gear VCO 102. For example, when the low gear VCO 102 is selected by/activated by the system 100, such as via a gear selection setting (ex.—gear selection="low") provided by the calibration engine 106, the first power supply regulator 108 may provide a supply voltage to the low gear VCO 102 (ex.—a 1V supply voltage, during typical operation). Further, the second power supply regulator 110 may be configured for being connected with the high gear VCO 104 and may further be configured for selectively providing power to the high gear VCO 104. For instance, when the high gear VCO 104 is selected by/activated by the system 100, such as via a gear selection setting (ex.—gear selection="high") provided by the calibration engine 106, the second power supply regulator 110 may provide a supply voltage to the high gear VCO 104 (ex.—a 1V supply voltage, during typical operation).

In further embodiments, when the low gear VCO 102 is selected by the system 100 to be inactive, the first power supply regulator 108 may be configured for being shut off by the system 100 and the supply voltage to be supplied to the low gear VCO 102 may be set to zero volts by the system 100. Further, when the high gear VCO 104 is selected by the system 100 to be inactive, the second power supply regulator 110 may be configured for being shut off by the system 100 and the supply voltage to be supplied to the high gear VCO 104 may be set to zero volts by the system 100. Additionally, when the low gear VCO 102 is selected by the system 100 to be inactive (and the high gear VCO 102 is selected by the system 100 to be active), the first power supply regulator 108 may be configured for being shut off by the system 100 and the supply voltage to be supplied to the low gear VCO 102 may be set to zero volts by the system 100, thereby promoting prevention of undesired coupling between active and inactive VCOs. Still further, when the high gear VCO 104 is selected by the system 100 to be inactive (and the low gear VCO 104 is selected by the system 100 to be active), the second power supply regulator 110 may be configured for being shut off by the system 100 and the supply voltage to be supplied to the high gear VCO 104 may be set to zero volts by the system 100, thereby promoting prevention of undesired coupling between active and inactive VCOs.

In additional embodiments of the present invention, the system 100 may include a bandgap reference circuit 112. The bandgap reference circuit 112 may be configured for being connected to/communicatively coupled with the first power supply regulator 108 and/or the second power supply regulator 110. Further, the system 100 may include a multiplexer 114. The multiplexer 114 may be configured for being connected to/communicatively coupled with the low gear VCO 102 and/or the high gear VCO 104. The multiplexer 114 may be further configured for receiving inputs/input signals from the low gear VCO 102 and/or the high gear VCO 104, and for providing output(s) (ex.—VCO output(s)) based on said inputs/input signals. For example, the multiplexer 114 may be configured for selectively receiving inputs/input signals from either the low gear VCO 102 or the high gear VCO 104 as directed/determined by the gear control code (ex.—gear control).

Referring generally to FIG. 2, a flow diagram illustrating a calibration sequence performed by the system 100 in accordance with an exemplary embodiment of the present invention is shown. As discussed above, during chip power on, the mixed mode VCO calibration engine 106 may be configured for automatically setting/providing a desired/proper VCO fix capacitor band code (ex.—PLLF<2:0>) and a desired/proper gear control code (ex.—gear selection) for/to the system 100 through a calibration process (such as shown in FIG. 2). During the calibration process, the VCO calibration engine 106 is configured for comparing a VCO control voltage (ex.—Vtune) of the system 100 with an upper threshold voltage for the system 100 and a lower threshold voltage for the system 100. The upper threshold voltage and the lower threshold voltage may be values which form/provide an allowable control voltage range for the system 100. For example, the lower threshold voltage may be 200 millivolts (mV) and the upper threshold voltage may be 800 millivolts (mV) for providing an allowable control voltage range of 200 mV to 800 mV for the system 100. Based on the results of said comparison, the VCO calibration is configured for providing a decision output, such as a 2-bit decision output (ex.—DEC<1:0>). For instance, based on said comparison, when the VCO calibration engine 106 determines that Vtune is larger/greater than the lower threshold voltage and greater than the upper threshold voltage, the 2-bit decision output provided by the VCO calibration engine 106 may be 11. (ex.—DEC<1:0>=11). Alternatively, based on said comparison, when the VCO calibration engine 106 determines that Vtune is greater than or equal to the lower threshold voltage and less than or equal to the upper threshold voltage, the 2-bit decision output provided by the VCO calibration engine 106 may be 01. (ex.—DEC<1:0>=01). Further, based on said comparison, when the VCO calibration engine 106 determines that Vtune is less than the lower threshold voltage and less than the upper threshold voltage, the 2-bit decision output provided by the VCO calibration engine 106 may be 00 (ex.—DEC<1:0>=00). In exemplary embodiments, the VCO calibration engine 106 is configured for calibrating or changing the VCO fix capacitor band code (ex.—PLLF<2:0>) and the gear control code (ex.—gear selection) based on the 2-bit decision output it provides. In further embodiments, the higher the value of the VCO fix capacitor band code/control bit (ex.—PLLF<2:0>), the higher the VCO oscillation speed.

As discussed above, FIG. 2 is a flow diagram illustrating an exemplary calibration process/method 200 as carried out by the calibration engine 106 of the system 100 of the present invention. The method 200 may include automatically establishing and providing a gear control setting 202 (ex.—gear selection, gear ctrl) and a VCO fix capacitor band code setting/control bit setting (ex.—PLLF<2:0>) as shown in FIG. 1, or pllf<2:0> as shown in FIG. 2). For instance, the gear control setting may be "low" (ex.—may be established as a low setting) and pllf<2:0> may be "110". The method 200 may further include automatically comparing a VCO control voltage (ex.—Vtune) of the system 100 to an upper threshold voltage and a lower threshold voltage 204, the lower threshold voltage forming a minimum value of an allowable control voltage range (ex.—a minimum allowable control voltage) for the system 100, the upper threshold voltage forming a maximum value of an allowable control voltage range (ex.—a maximum allowable control voltage) for the system 100. When the comparison (at step 204) results in a determination that the VCO control voltage is greater than or equal to the lower threshold voltage and less than or equal to the upper threshold voltage, the method 200 may further include providing a decision output (ex.—DEC<1:0>=01) which causes the gear control setting and the VCO fix capacitor band code setting/control bit setting to be saved and which further causes the calibration process to be ended/provides an indication or signal that the calibration process is to be ended 206. For instance, when step 206 occurs, it is indicative that the calibration engine 106 has determined that no further calibration need be attempted and that the current settings (ex.—pllf<2:0>=110; gear control=low) allow for the system 100 to function properly/as desired (ex.—allow for a proper/allowable control voltage to be established).

In alternative embodiments, when the comparison (at step 204) results in a determination that the VCO control voltage is less than the lower threshold voltage, the method 200 may further include determining if the VCO fix capacitor band code setting/control bit setting is 000/is equal to 000. (Step 208). When the VCO fix capacitor band code setting is determined as being 000/being equal to 000, the method 200 may further include providing an indication to the system 100 that calibration has failed 210 (ex.—that frequency is outside of/less than a lower bound). Alternatively, when the VCO fix capacitor band code setting is determined as not being 000/as not being equal to 000, the method 200 may further include decrementing the VCO fix capacitor band code setting (ex.—decrementing by 1) 212 and repeating the calibration process as described above by providing the decremented VCO fix capacitor band code setting (along with the previously provided gear control setting) to the system 100 (as was done with the initially-provided gear control setting and band control setting in step 202).

In further alternative embodiments, when the comparison (at step 204) results in a determination that the VCO control voltage is greater than the upper threshold voltage, the method 200 may further include determining if the VCO fix capacitor band code setting/control bit is 111/is equal to 111. (Step 214). When the VCO fix capacitor band code setting is determined as not being 111/as not being equal to 111, the method 200 may further include incrementing the VCO fix capacitor band code setting (ex.—incrementing by 1) 216 and repeating the calibration process 200 as described above by providing the incremented VCO fix capacitor band code setting (along with the previously provided gear control setting) to the system 100. (as was done with the initially-provided gear control setting and band control setting in step 202). Alternatively, when the VCO fix capacitor band code setting is determined as being 111/as being equal to 111, the method 200 may further include determining if the gear control setting is "low". (Step 218). When the gear control setting is determined as not being "low", the method 200 further includes providing an indication to the system 100 that calibration has failed 220 (ex.—that frequency is outside of/beyond an upper bound). When the gear control setting is determined as being "low", the method 200 further includes adjusting the gear control setting to "high" (ex.—adjusting/establishing the gear control setting to/at a high setting) and adjusting the VCO fix capacitor band code setting to "110" (Step 222) and repeating the calibration process 200 by providing the adjusted gear control setting and the adjusted VCO fix capacitor band code setting to the system 100. (as was done with the initially-provided gear control setting and band control setting in step 202).

Figure 3:
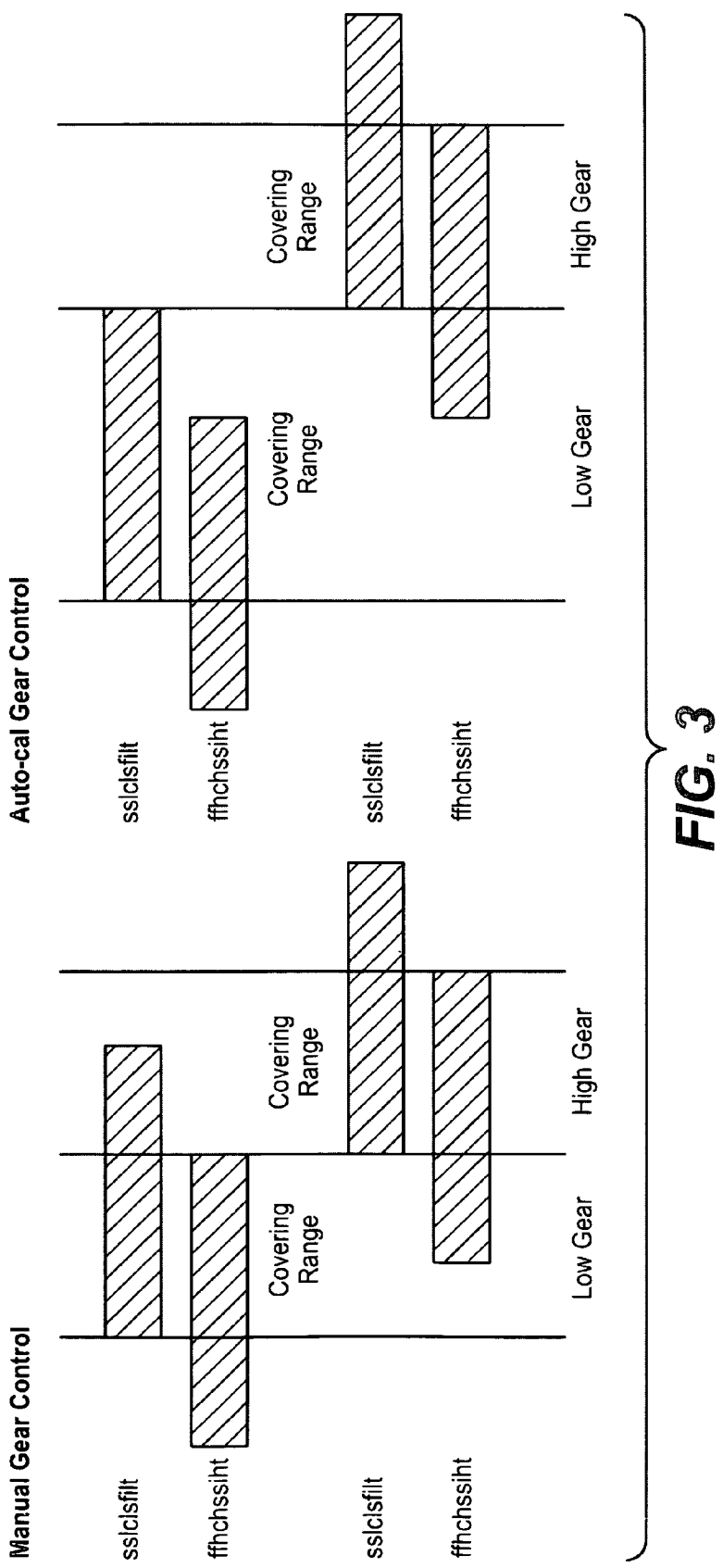
FIG. 3 is a graphical depiction illustrating attainable frequency ranges when manually establishing a gear setting compared to attainable frequency ranges for a system, as shown in FIG. 1, where the system implements an automatic calibration process as shown in FIG. 2 in accordance with an exemplary embodiment of the present invention.

In exemplary embodiments, the system 100 of the present invention provides a novel, two-gear, 8-capacitor-band, wide range VCO/LCVCO of 8-13 GHz with a calibration step for the selection of the high gear VCO 104 (ex.—gear control setting is "high") or the low gear VCO 102 (ex.—gear control setting is "low") to exploit the dual-band benefits of the system 100 of the present invention. Further, the system 100 of the present invention allows for automatic calibration. FIG. 3 represents a comparison of attainable frequency/tuning ranges when establishing the gear control setting manually as opposed to establishing the gear control setting via automatic calibration. The shaded rectangular bars in FIG. 3 show frequency ranges for the system 100 (ex.—the VCO/the LCVCO/the LC tank VCO system) in high gear and low gear respectively. Inside each gear, for certain Process Voltage Temperature (PVT) corners, the VCO will oscillate faster than others. For example, the fast extreme sslclcfilt (transistor in slow nmos slow pmos corner, capacitor in low cap low stray corner, inductor in small inductance corner and at low temperature) and slow extreme ffhchssiht (transistor in fast nmos fast pmos corner, capacitor in high cap high stray corner, inductor in large inductance corner and at high temperature) frequency bands are shown. In order to provide/guarantee full range coverage, high gear frequency band must overlap with the low gear frequency band. If gear is set manually, each gear would need to cover the pre-assigned frequency band over PVT, just as shown in FIG. 3. Unnecessary frequency band overlapping may reduce the final achievable total frequency range. With the above-described approaches, the system 100 of the present invention may achieve a frequency tuning range at least twice as large/broad as was previously reported/available. For instance, the frequency tuning range for the system 100 of the present invention may be expanded to approximately +/−25% as opposed to the +/−10% frequency range that is typically reported by industry. The larger/expanded tuning range of the system 100 of the present invention may allow for multiple standards to be supported by a transceiver core, thereby promoting increased flexibility.

Further, silicon results for the system 100 of the present invention show a comfortable VCO range converge between 8 GHz and 13 GHz over PVT. Over the 8-13 GHz frequency range, the phase noise for the system 100 of the present invention may be approximately −110 dBc/Hz at 1 Megahertz (MHz) frequency offset, which is similar to a regular single band LC tank VCO. Thus, the system 100 (ex.—wide range LC tank VCO) of the present invention may achieve desired tuning range benefits without sacrificing performance. Although, the system 100 of the present invention may occupy a larger area than previous solutions, it is acceptable since the system 100 may allow a PLL to support multiple transceiver ports, thereby making average overhead for each port relatively small. In further embodiments, the concepts implemented in the above-referenced system 100 may be expanded to multiple (ex.—more than two) band LCVCO architectures for further expanding tuning range.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A self-calibrating, dual-band, wide range LC tank Voltage-Controlled Oscillator (VCO) system, comprising:
a first Voltage-Controlled Oscillator (VCO);
a second Voltage-Controlled Oscillator (VCO);
a calibration engine, the calibration engine configured for being connectable to at least one of the first VCO and the second VCO, the calibration engine further configured for automatically establishing and automatically providing a VCO fix capacitor band code setting and a gear control setting, the gear control setting causing the VCO system to selectively activate one of: the first VCO and the second VCO, and further causing the VCO system to selectively inactivate one of: the first VCO and the second VCO, the first VCO configured for providing a first targeted central frequency value, the second VCO configured for providing a second targeted central frequency value, the second targeted frequency value being greater than the first targeted central frequency value, wherein the calibration engine is further configured for automatically comparing a VCO control voltage of the system to a lower threshold voltage and an upper threshold voltage, the lower threshold voltage being a minimum allowable control voltage for the system, the upper threshold voltage being a maximum allowable control voltage for the system, the calibration engine being further configured for at least one of automatically adjusting the VCO fix capacitor band code setting and automatically adjusting the gear control setting when the VCO control voltage is at least one of greater than the upper threshold voltage and lower than the lower threshold voltage;
a first power supply regulator, the first power supply regulator configured for being connected to the first VCO and providing a supply voltage to the first VCO, the first power supply regulator further configured for being connected to the calibration engine, wherein when the first VCO is selected by the system to be inactive and the second VCO is selected by the system to be active, the first power supply regulator is powered off by the system, thereby causing the supply voltage supplied from the first power supply regulator to the first VCO to be zero volts;

a second power supply regulator, the second power supply regulator configured for being connected to the second VCO and providing a supply voltage to the second VCO, the second power supply regulator further configured for being connected to the calibration engine, wherein when the second VCO is selected by the system to be inactive and the first VCO is selected by the system to be active, the second power supply regulator is powered off by the system, thereby causing the supply voltage supplied from the second power supply regulator to the second VCO to be zero volts;

a bandgap reference circuit, the bandgap reference circuit being communicatively coupled with one of: the first power supply regulator and the second power supply regulator.

2. A system as claimed in claim 1, wherein the first VCO is a low gear VCO, and the first targeted central frequency value provided by the first VCO is a value included in a range of values ranging from 8 Gigahertz (GHz) to 10.5 Gigahertz (GHz).

3. A system as claimed in claim 1, wherein the second VCO is a high gear VCO, and the second targeted central frequency value provided by the second VCO is a value included in a range of values ranging from 10.5 Gigahertz (GHz) to 13 Gigahertz (GHz).

4. A system as claimed in claim 1, wherein the calibration engine is a mixed mode VCO calibration engine.

5. A method for providing a self-calibrating, dual-band, wide range LC tank Voltage-Controlled Oscillator (VCO) system, said system including a first VCO and a second VCO, the method comprising:

during chip power-on, providing a gear control setting and a VCO fix capacitor band code setting, wherein the gear control setting causes the VCO system to selectively activate one of: the first VCO and the second VCO, and further causes the VCO system to selectively inactivate one of: the first VCO and the second VCO, the first VCO configured for providing a first targeted central frequency value, the second VCO configured for providing a second targeted central frequency value, the second targeted frequency value being greater than the first targeted central frequency value, wherein when the first VCO is selected by the system to be inactive and the second VCO is selected by the system to be active, a first power supply regulator, configured for providing power to the first VCO, is powered off by the system, thereby causing the supply voltage supplied from the first power supply regulator to the first VCO to be zero volts, when the second VCO is selected by the system to be inactive and the first VCO is selected by the system to be active, a second power supply regulator, configured for providing power to the second VCO, is powered off by the system by the system, thereby causing the supply voltage supplied from the second power supply regulator to the second VCO to be zero volts;

comparing a VCO control voltage of the system to a minimum allowable control voltage for the system and a maximum allowable control voltage for the system;

receiving an input at a multiplexer, said input provided from one of: the first VCO and the second VCO;

providing an output from the multiplexer based on said received input; and when the VCO control voltage is determined as being at least one of greater than the minimum allowable control voltage and equal to the minimum allowable control voltage and when the VCO control voltage is determined as being at least one of less than the maximum allowable control voltage and equal to the maximum allowable control voltage, saving the gear control setting and the VCO fix capacitor band code setting and providing an indication that calibration is finished.

6. A method as claimed in claim 5, further comprising:
when the VCO control voltage is determined as being less than the minimum allowable control voltage, determining if the VCO fix capacitor band code setting is 000.

7. A method as claimed in claim 6, further comprising:
when the VCO fix capacitor band code setting is determined as being 000, providing an indication that calibration has failed.

8. A method as claimed in claim 6, further comprising:
when the VCO fix capacitor band code setting is determined as not being 000, decrementing the VCO fix capacitor band code setting; and
providing the decremented VCO fix capacitor band code setting.

9. A method as claimed in claim 5, further comprising:
when the VCO control voltage is determined as being greater than the maximum allowable control voltage, determining if the VCO fix capacitor band code setting is 111.

10. A method as claimed in claim 9, further comprising:
when the VCO fix capacitor band code setting is determined as not being 111, incrementing the VCO fix capacitor band code setting; and
providing the incremented VCO fix capacitor band code setting.

11. A method as claimed in claim 9, further comprising:
when the VCO fix capacitor band code setting is determined as being 111, determining if the gear control setting is established at low setting.

12. A method as claimed in claim 11, further comprising:
when the gear control setting is determined as not being established at low setting, providing an indication that calibration has failed.

13. A method as claimed in claim 11, further comprising:
when the gear control setting is determined as being established at low setting, adjusting the gear control setting to high setting and adjusting the VCO fix capacitor band code setting to 110; and
providing the adjusted gear control setting and the adjusted VCO fix capacitor band code setting.

14. A non-transitory, computer-readable medium having computer-executable instructions for performing a method for providing a self-calibrating, dual-band, wide range LC tank Voltage-Controlled Oscillator (VCO) system, said system including a first VCO and a second VCO, said method comprising:

providing a gear control setting and a VCO fix capacitor band code setting, wherein the gear control setting causes the VCO system to selectively activate one of: the first VCO and the second VCO, and further causes the VCO system to selectively inactivate one of: the first VCO and the second VCO, the first VCO configured for providing a first targeted central frequency value, the second VCO configured for providing a second targeted central frequency value, the second targeted frequency value being greater than the first targeted central frequency value, wherein when the first VCO is selected by the system to be inactive and the second VCO is selected by the system to be active, a first power supply regulator, configured for providing power to the first VCO, is powered off by the system, thereby causing the supply voltage supplied from the first power supply regulator to the first VCO to be zero volts, when the second VCO is selected by the system to be inactive and the first VCO is selected by the system to be active, a second power supply regulator, configured for providing power to the second VCO, is powered off by the system, thereby causing the supply voltage supplied from the second power supply regulator to the second VCO to be zero volts;

comparing a VCO control voltage of the system to a minimum allowable control voltage for the system and a maximum allowable control voltage for the system;

receiving an input at a multiplexer, said input provided from one of: the first VCO and the second VCO;

providing an output from the multiplexer based on said received input; and when the VCO control voltage is determined as being at least one of greater than the minimum allowable control voltage and equal to the minimum allowable control voltage and when the VCO control voltage is determined as being at least one of less than the maximum allowable control voltage and equal to the maximum allowable control voltage, saving the gear control setting and the VCO fix capacitor band code setting and providing an indication that calibration is finished.

15. A computer-readable medium as claimed in claim 14, said method further comprising:

when the VCO control voltage is determined as being less than the minimum allowable control voltage, determining if the VCO fix capacitor band code setting is 000;

when the VCO fix capacitor band code setting is determined as being 000, providing an indication that calibration has failed; and when the VCO fix capacitor band code setting is determined as not being 000, decrementing the VCO fix capacitor band code setting and providing the decremented VCO fix capacitor band code setting.

16. A computer-readable medium as claimed in claim 14, said method further comprising:

when the VCO control voltage is determined as being greater than the maximum allowable control voltage, determining if the VCO fix capacitor band code setting is 111; and when the VCO fix capacitor band code setting is determined as not being 111, incrementing the VCO fix capacitor band code setting and providing the incremented VCO fix capacitor band code setting.

17. A computer-readable medium as claimed in claim 16, said method further comprising:

when the VCO fix capacitor band code setting is determined as being 111, determining if the gear control setting is established at low setting.

18. A computer-readable medium as claimed in claim 17, said method further comprising:

when the gear control setting is determined as not being established at low setting, providing an indication that calibration has failed.

19. A computer-readable medium as claimed in claim 17, said method further comprising:

when the gear control setting is determined as being established at low setting, adjusting the gear control setting to high setting and adjusting the VCO fix capacitor band code setting to 110; and providing the adjusted gear control setting and the adjusted VCO fix capacitor band code setting.

* * * * *